(12) United States Patent
Choi et al.

(10) Patent No.: US 11,031,053 B2
(45) Date of Patent: Jun. 8, 2021

(54) DERIVATIVE RECEIVER

(71) Applicants: SK hynix Inc., Icheon (KR); Seoul National University R&DB Foundation, Seoul (KR)

(72) Inventors: Sungphil Choi, Seoul (KR); Suhwan Kim, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/871,396

(22) Filed: May 11, 2020

(65) Prior Publication Data

US 2021/0104265 A1 Apr. 8, 2021

(30) Foreign Application Priority Data

Oct. 8, 2019 (KR) .................. 10-2019-0124333
May 4, 2020 (KR) .................. 10-2020-0053167

(51) Int. Cl.
*G06F 13/00* (2006.01)
*G11C 7/10* (2006.01)
*G11C 7/22* (2006.01)
*G11C 11/4076* (2006.01)

(52) U.S. Cl.
CPC ............ *G11C 7/1087* (2013.01); *G11C 7/109* (2013.01); *G11C 7/1093* (2013.01); *G11C 7/22* (2013.01); *G11C 11/4076* (2013.01)

(58) Field of Classification Search
CPC ..... G11C 7/1087; G11C 7/109; G11C 7/1093; G11C 7/22; G11C 11/4076
USPC ...................................... 365/189.05
See application file for complete search history.

(56) References Cited

U.S. PATENT DOCUMENTS

| 7,903,764 | B2 | 3/2011 | Yu et al. | |
| 9,425,905 | B2 | 8/2016 | Lee et al. | |
| 2014/0080430 | A1* | 3/2014 | Lee | H04B 13/005 |
| | | | | 455/91 |

FOREIGN PATENT DOCUMENTS

KR 10-0706732 B1 4/2007

* cited by examiner

*Primary Examiner* — Xiaochun L Chen (57) ABSTRACT

A derivative receiver includes a differentiator configured to differentiate an input signal; a comparator configured to produce a comparison signal by comparing a derivative signal produced using an output from the differentiator with a threshold voltage; and a pattern detecting equalizer configured to output a data signal by sampling an equalization signal generated by adjusting a level of the comparison signal. The level of the comparison signal is adjusted according to a past value of the data signal.

16 Claims, 8 Drawing Sheets

<Prior Art>

DERIVATIVE RECEIVER

CROSS-REFERENCE TO RELATED APPLICATIONS

The present application claims priority under 35 U.S.C. § 119(a) to Korean Patent Application No. 10-2019-0124333, filed on Oct. 8, 2019 and Korean Patent Application No. 10-2020-0053167, filed on May 4, 2020, which are incorporated herein by reference in its entirety.

BACKGROUND

1. Technical Field

Various embodiments relate to a derivative receiver for receiving an input signal by differentiating the input signal.

2. Related Art

Figure 1A:
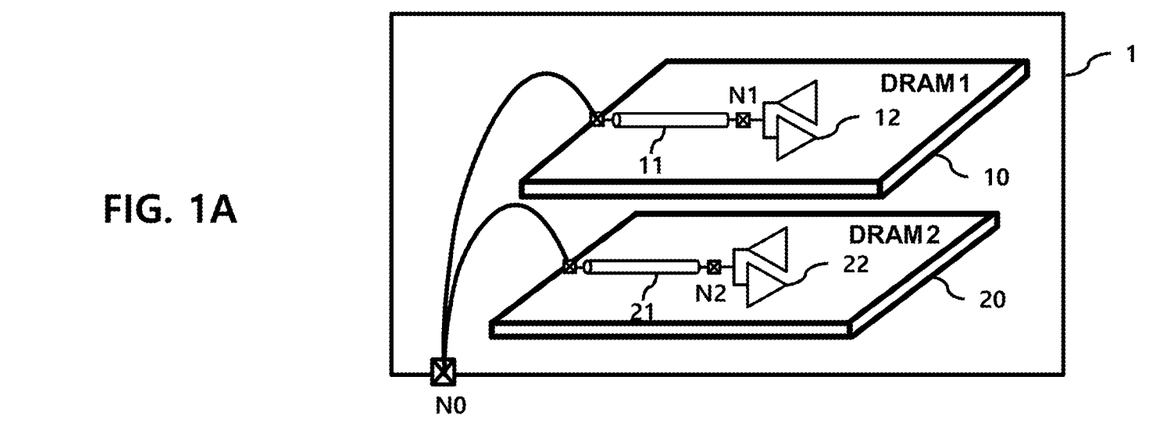
FIGS. 1A and 1B illustrate a semiconductor device including a plurality of internal channels and signal propagation through the semiconductor device.

FIG. 1A is a diagram illustrating a semiconductor device 1 including internal channels 11 and 21.

The semiconductor device 1 includes a plurality of dies 10 and 20 which may be Dynamic Random Access Memory (DRAM) dies.

The plurality of dies 10 and 20 are connected to a device terminal N0 provided in the semiconductor device 1 through wire bonding.

The device terminal N0 is connected to the external channel 2 (shown in FIG. 1B) to transmit and receive a signal.

Dies 10 and 20 provides a signal input via wire bonding to the receivers 12 and 22 via the internal channels 11 and 21 respectively.

Figure 1B:
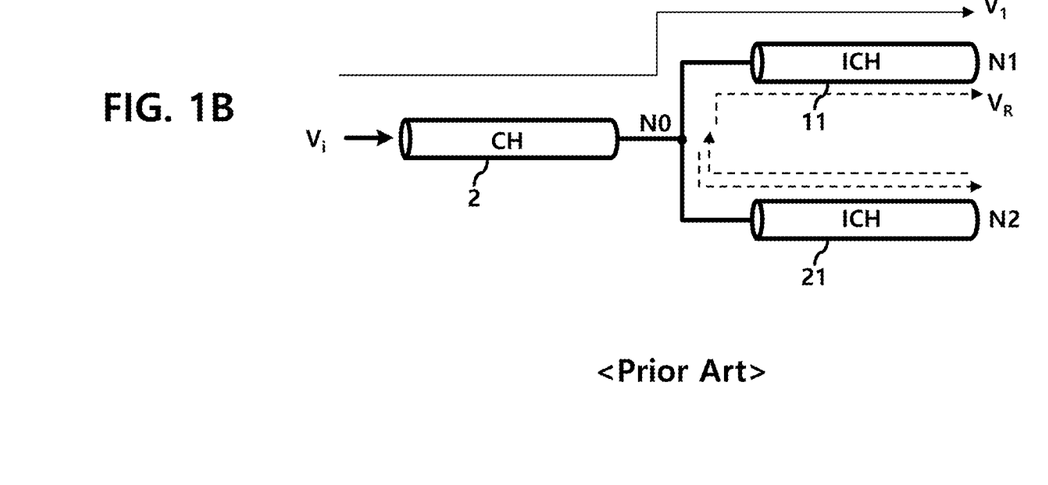

In FIG. 1B, a signal Vi input through an external channel CH is provided to a receiver 12 of a die 10.

The signal input to the receiver 12 includes a first signal $V_1$ transmitted via the external channel 2, the device terminal N0, and the internal channel 11 and a first node N1, and a reflection signal $V_R$ transmitted via the external channel 2, the device terminal N0, the internal channel 21, a second node N2, the internal channel 21 again, the device terminal N0 again, the internal channel 11, and the first node N1.

Figure 2:
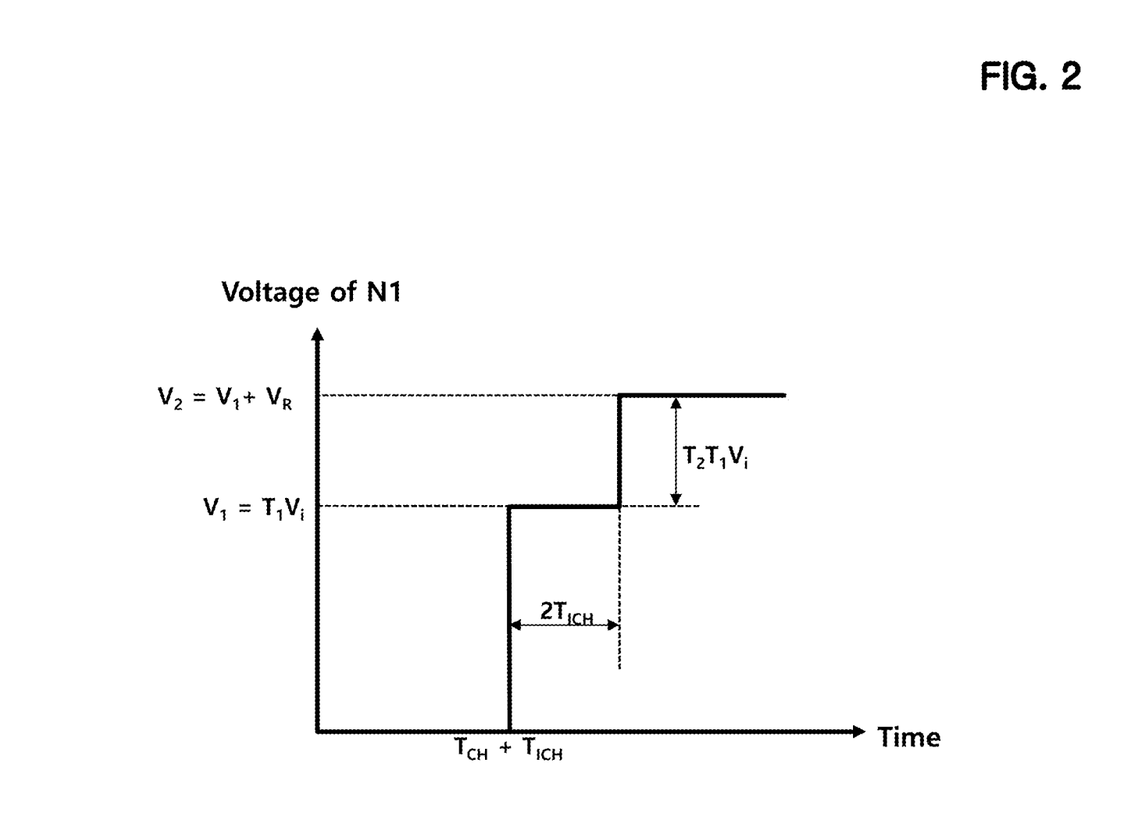
FIG. 2 illustrates a graph representing a signal transmitted through the internal channels.

FIG. 2 is a graph showing voltage at the first node N1 over time.

The first signal $V_1$ appears after the elapse of external channel transmission time $T_{CH}$ and internal channel transmission time $T_{ICH}$.

In this case, the first signal $V_1$ is a value obtained by multiplying the input voltage $V_i$ by the first transmission coefficient $T_1$.

The first transmission coefficient $T_1$ represents a ratio of a signal input to the receiver 12 to a signal being transmitted through the external channel CH, the device terminal N0 and the first node N1.

Since the reflection signal $V_R$ appears at the first node N1 after passing twice through the internal channel 21 and through the internal channel 11, it appears after twice the internal channel transmission time $T_{ICH}$ has elapsed from the appearance of the first signal $V_1$.

The reflection signal $V_R$ is a signal that is transmitted after being reflected at the input terminal of the receiver 22.

When the receiver 12 operates, the receiver 22 is in a floating state, and therefore the magnitude of the signal reflected at the input terminal of the receiver 22 is equal to the magnitude of the first signal $V_1$.

The reflected signal $V_R$ is a value obtained by multiplying the reflected signal by the second transmission coefficient $T_2$.

The second transmission coefficient $T_2$ represents a ratio of a signal input the receiver 12 to a signal transmitted via the second node N2, the terminal N0, and the first node N1.

As such, when one of a plurality of dies each having an internal channel is connected to an external channel to receive a signal, distortion occurs in the received signal due to a signal reflected at the other die, thereby causing an error when receiving data at high speed.

SUMMARY

In accordance with an embodiment of the present disclosure, a derivative receiver may include a differentiator circuit configured to differentiate an input signal; a comparator circuit configured to produce a comparison signal by comparing a derivative signal produced using an output from the differentiator circuit with a threshold voltage; and a pattern detecting equalizer circuit configured to produce a data signal by sampling an equalization signal generated by adjusting a level of the comparison signal, wherein the level of the comparison signal is adjusted according to a past value of the data signal.

In accordance with an embodiment of the present disclosure, a method of receiving data performed in a receiver circuit may comprise differentiating an input signal; comparing a threshold voltage with a derivative signal produced using a result of differentiating the input signal; generating an equalization signal by adjusting a level of the comparison signal according to a past value of a data signal; and producing the data signal by sampling the equalization signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Figure 3:
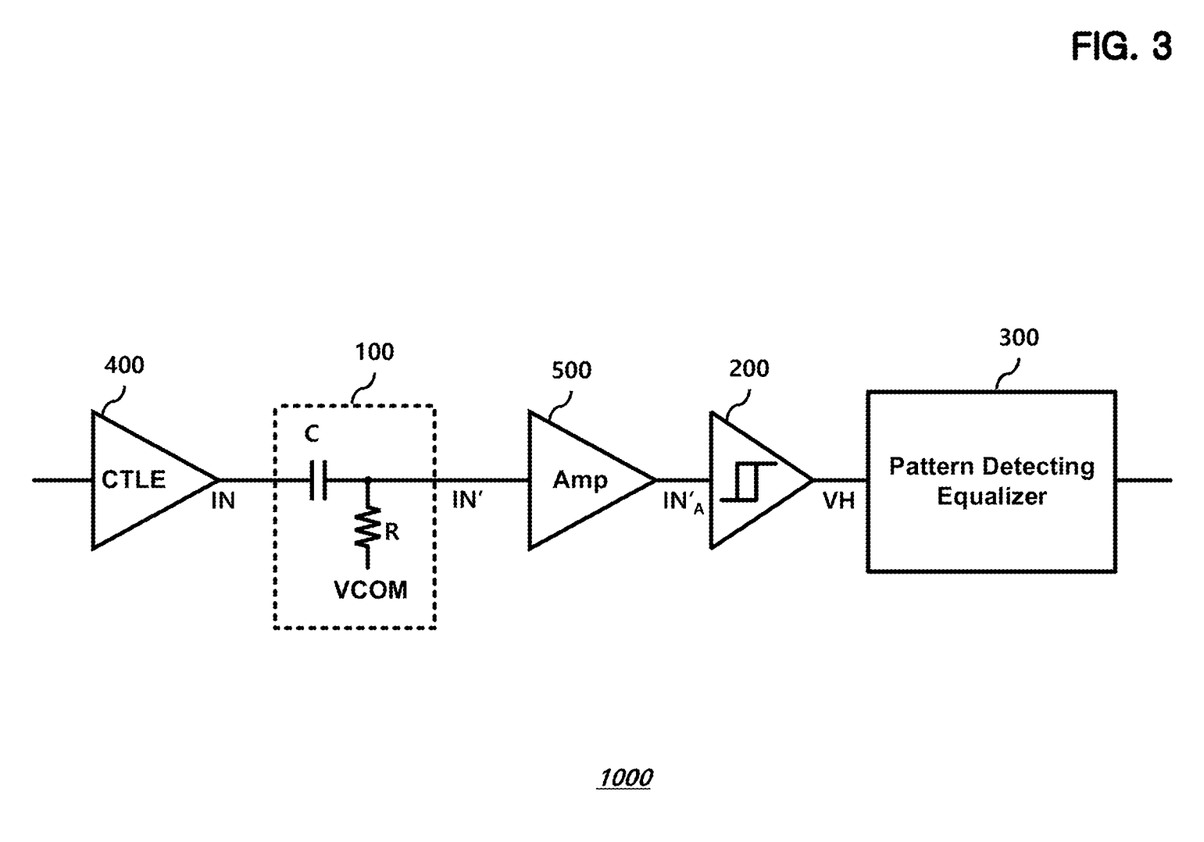
FIG. 3 illustrates a derivative receiver according to an embodiment of the present disclosure.

Various embodiments will be described below with reference to the accompanying figures. Embodiments are pro- FIG. 3 illustrates a derivative receiver 1000 according to an embodiment of the present disclosure.

The derivative receiver 1000 according to an embodiment of the present disclosure includes a differentiator 100 outputting a signal by differentiating an input signal, a hysteresis comparator 200 comparing a signal output from the differentiator 100 and having hysteresis characteristics, and a pattern detecting equalizer 300 performing an equalization operation on the output of the hysteresis comparator 200.

The differentiator 100 may include a capacitor C connected between an input terminal and an output terminal and a resistor R connected between the output terminal and a common voltage terminal VCOM. The differentiator 100 outputs a derivative signal IN' by differentiating an input signal IN.

The derivative receiver 1000 may further include an equalizer 400 for performing an equalization operation on the signal input from the channel. The equalizer 400 may be a continuous time linear equalizer (CTLE) in the embodiment.

In an embodiment, the derivative receiver 1000 may further include an amplifier 500 that amplifies an output of the differentiator 100 and provides an amplified derivative signal $IN'_A$ to the hysteresis comparator 200.

However, hereinafter, the signal provided to the input of the hysteresis comparator 200 will be referred to as the derivative signal IN' without regard to whether it is the derivative signal IN' output by the differentiator 100 in one embodiment or the amplified derivative signal $IN'_A$ output by the amplifier 500 in another embodiment.

The hysteresis comparator 200 compares the derivative signal IN' with a threshold voltage and outputs a comparison signal VH.

Figure 4:
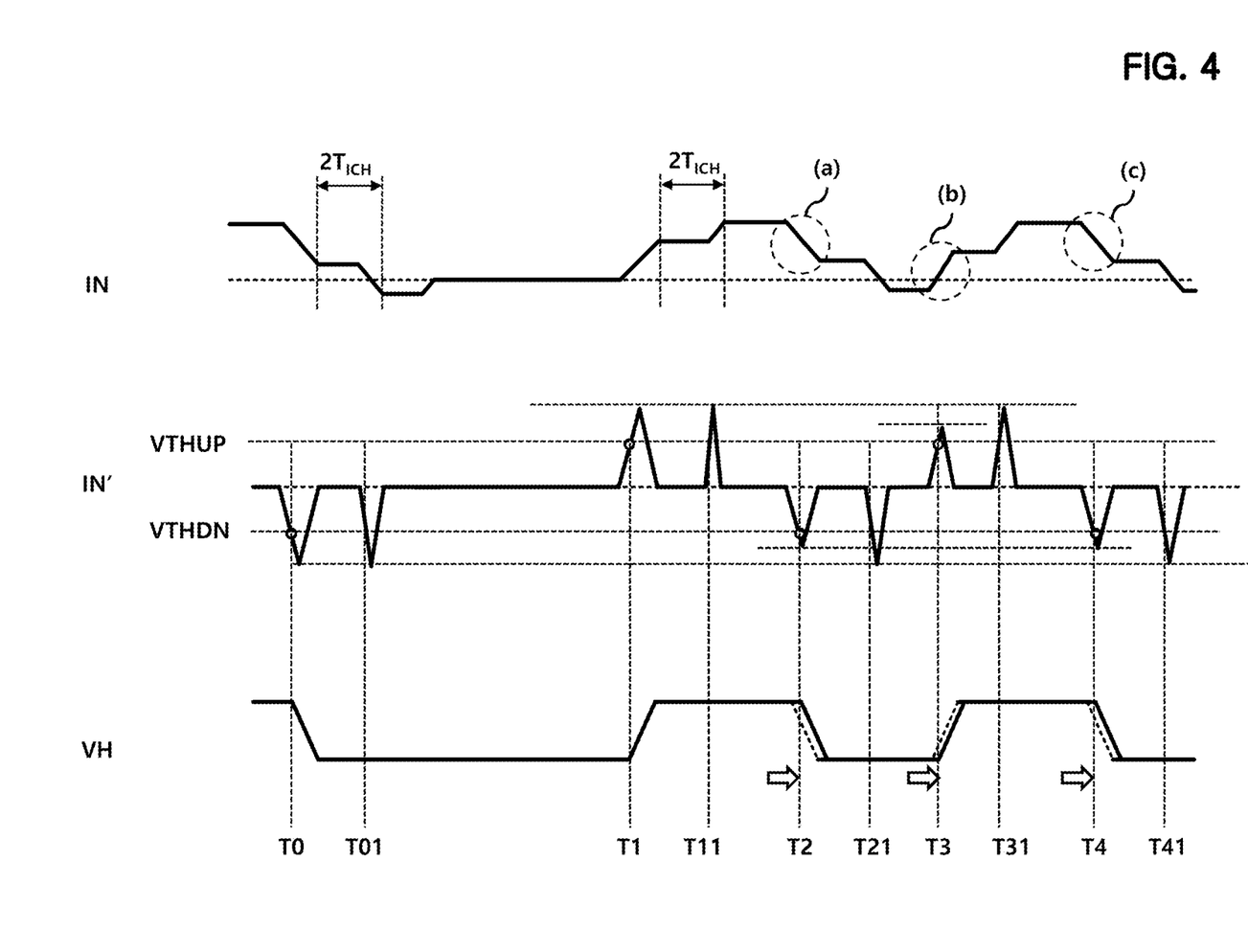
FIG. 4 illustrates operations of a differentiator and a hysteresis comparator according to an embodiment of the present disclosure.

FIG. 4 is a waveform diagram illustrating operations of the differentiator 100 and the hysteresis comparator 200 according to an embodiment of the present disclosure.

In the present embodiment, the input signal IN input to the differentiator 100 is a signal wherein reflection signals are mixed.

That is, a stepped waveform is generated when a data transition occurs due to the reflection signal arriving after a predetermined time $2 \cdot T_{ICH}$ as disclosed in FIG. 2.

As described above, the derivative signal IN' is a signal input to the hysteresis comparator 200 as an output signal of the differentiator 100 or an output signal of the amplifier 500.

When the input signal IN is differentiated, two peaks are generated in the derivative signal IN' each time a transition occurs because of the reflection signal.

For example, two downward peaks occur in the derivative signal IN' when the input signal IN transitions from a high level to a low level and two upward peaks occur in the derivative signal IN' when the input signal IN transitions from the low level to the high level.

The hysteresis comparator 200 outputs the comparison signal VH having the low level in response to the derivative signal IN' being smaller than a downward threshold voltage VTHDN, and outputs the comparison signal VH having the high level in response to the derivative signal IN' being greater than a upward threshold voltage VTHUP. When the derivative signal IN' has a value between the downward threshold voltage VTHDN and the upward threshold voltage VTHUP, the hysteresis comparator 200 maintains the comparison signal VH at its current level.

Accordingly, even if two peaks occur in the derivative signal IN' due to the reflection signal included in the input signal IN, the comparison signal VH transitions at times T0, T1, T2, T3, and T4 and the comparison signal VH does not transition at times T01, T11, T21, T31, and T41.

The transition speed of the input signal IN may vary due to inter-symbol interference (ISI).

In FIG. 4, when there was no previous signal transition just before a signal transition, such as at T0 and T1, there is no change in the signal transition speed.

At the times indicated by (a) and (c) in FIG. 4, the falling speed of the input signal IN is decreased due to the rising transition of the input signal IN that occurred just before (a) and (c), and at the time indicated by (b) in FIG. 4, the rising speed of the input signal IN at (b) is decreased due to the falling transition of the input signal IN that occurred just before (b).

As a result, the peak of the derivative signal IN' in the corresponding time for (a), (b) and (c) becomes smaller in magnitude compared to the other peaks, the derivative signal IN' accordingly takes longer to reach the downward threshold voltage VTHDN or the upward threshold voltage VTHUP, and transition times of the comparison signal VH at (a), (b), and (c) are therefore slightly delayed due to the ISI.

A portion indicated by a dotted line in the comparison signal VH in FIG. 4 at (a), (b), and (c) corresponds to a case in which the ISI did not affect the transition times of the comparison signal VH, and a portion indicated by a solid line shows a delay of the transition time caused by the influence of the ISI.

The pattern detecting equalizer 300 adjusts the transition time of the signal by removing the effect of ISI.

Figure 5:
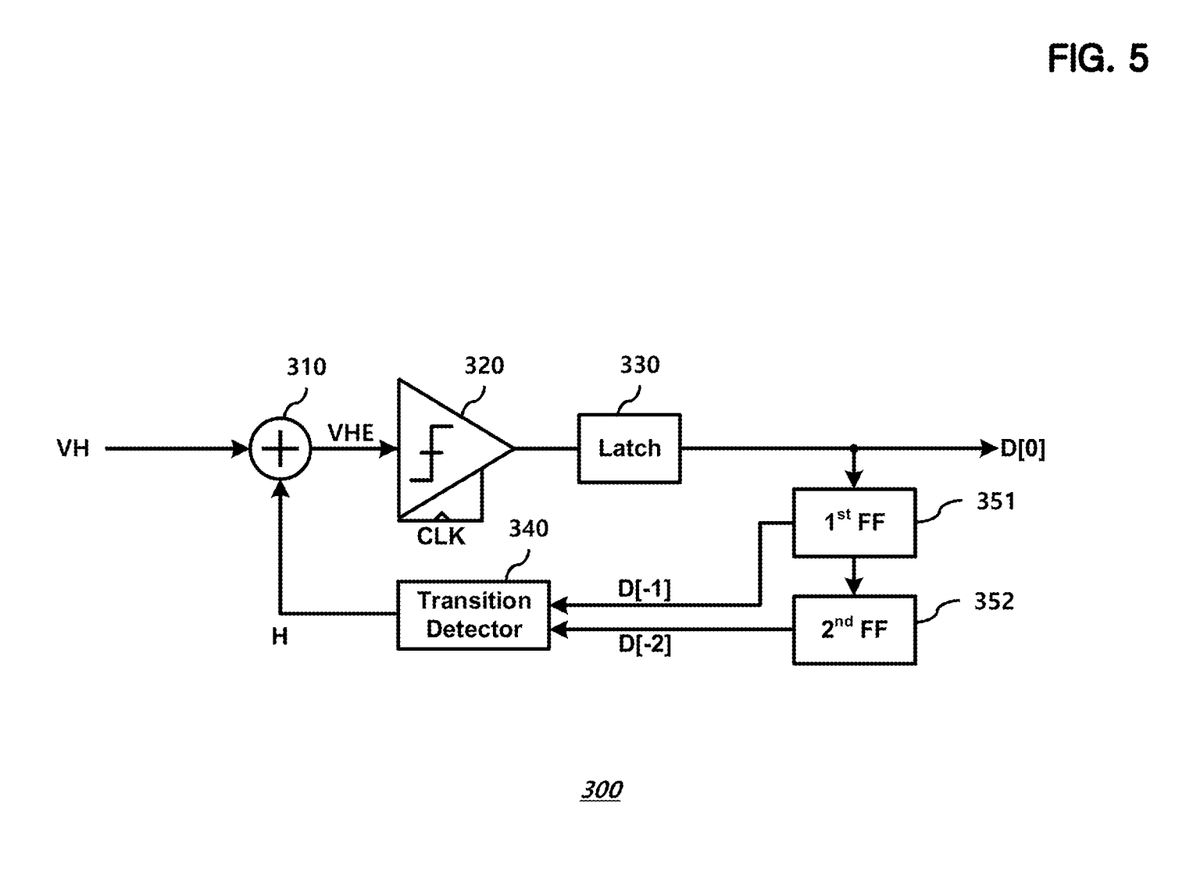
FIG. 5 illustrates a pattern detecting equalizer according to an embodiment of the present disclosure.

FIG. 5 illustrates a pattern detecting equalizer 300 according to an embodiment of the present disclosure.

The pattern detecting equalizer 300 includes a voltage adjusting circuit 310, a sampler 320, a latch 330, a transition detector 340, a first flip-flop 351, and a second flip-flop 352.

The voltage adjusting circuit 310 adjusts a voltage level of the comparison signal VH according to an equalization control signal H to output the equalization signal VHE.

The sampler 320 samples the equalization signal VHE according to a clock signal CLK.

In the present disclosure, the sampler 320 samples the equalization signal VHE at the rising edge of the clock signal CLK.

The latch 330 latches an output of the sampler 320 and outputs a data signal D[0].

The data signal D[0] output from the latch 330 may be referred to as a current value of data.

The first flip-flop 351 is clocked according to the clock signal CLK to produce the data signal D[−1] and the second flip-flop 352 is clocked according to the clock signal CLK to produce the data signal D[−2].

The data signal D[−1] may be referred to as a first past value corresponding to the value of the data signal D[0] output by the latch 330 before the most recent rising edge of the clock signal CLK, and the data signal D[−2] may be referred to as a second past value corresponding to the value of the data signal D[0] output by the latch 330 before the second most recent rising edge of the clock signal CLK.

The transition detector 340 outputs an equalization control signal H by referring to one or more past values of the data signal, that is, to by referring to the data signal D[−1], the data signal D[−2], or both.

Figure 6:
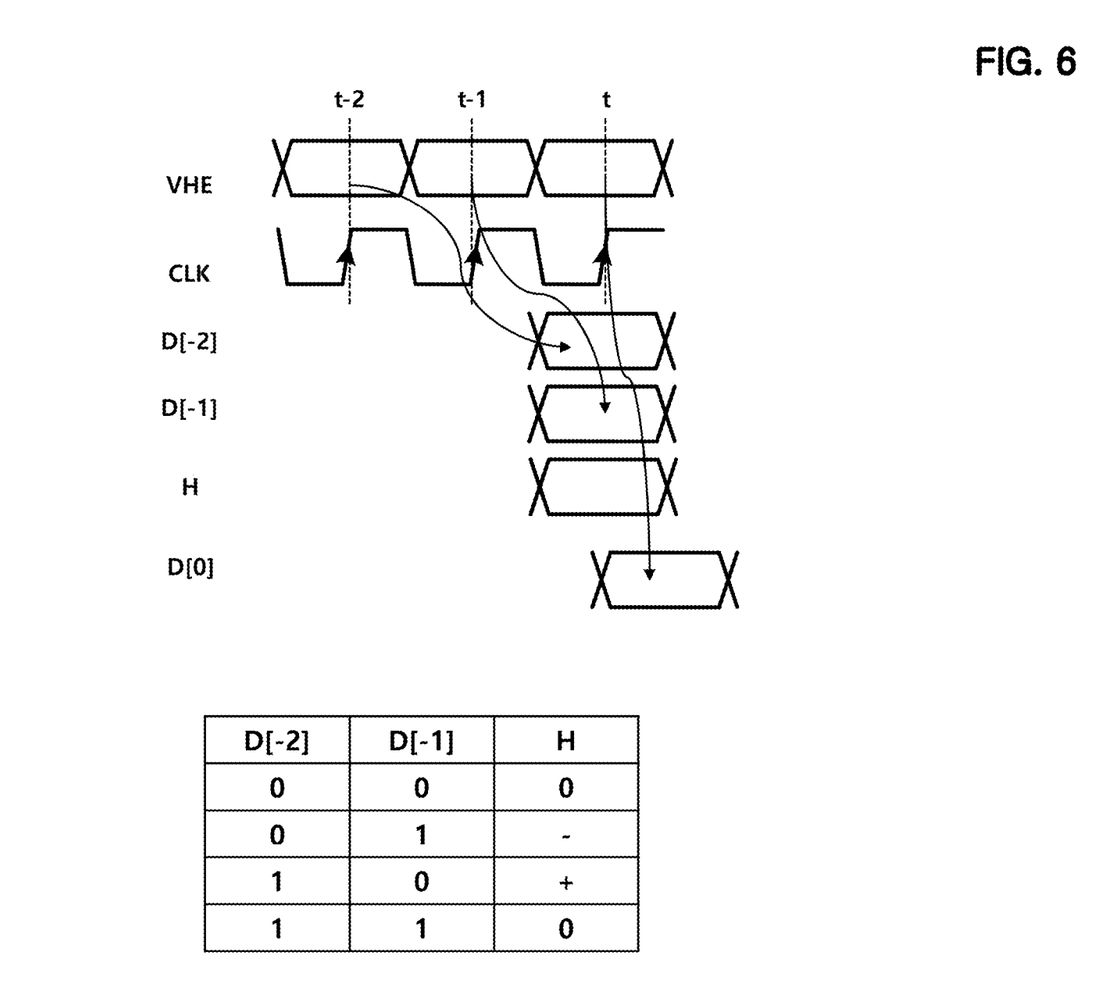
FIG. 6 illustrates a transition detector according to an embodiment of the present disclosure.

FIG. 6 is a waveform diagram and a table illustrating an operation of the transition detector 340 according to an embodiment.

The sampler 320 samples the equalization signal VHE at the rising edge of the clock signal CLK.

The transition detector 350 outputs the equalization control signal H determined according to the second past value sampled at t−2 and the first past value sampled at t−1.

As shown in the table, the transition detector 350 outputs 0 as the equalization control signal H when the first past value and the second past value are both 0 or both 1, which corresponds to there being no transition of the input signal IN just before the time t.

The transition detector 350 outputs a negative equalization control signal H when the second past value is 0 and the first past value is 1, which corresponds to there being a positive transition of the input signal IN just before the time t.

The transition detector 350 outputs a positive equalization control signal H when the second past value is 1 and the first past value is 0, which corresponds to there being a negative transition of the input signal IN just before the time t.

Figure 7:
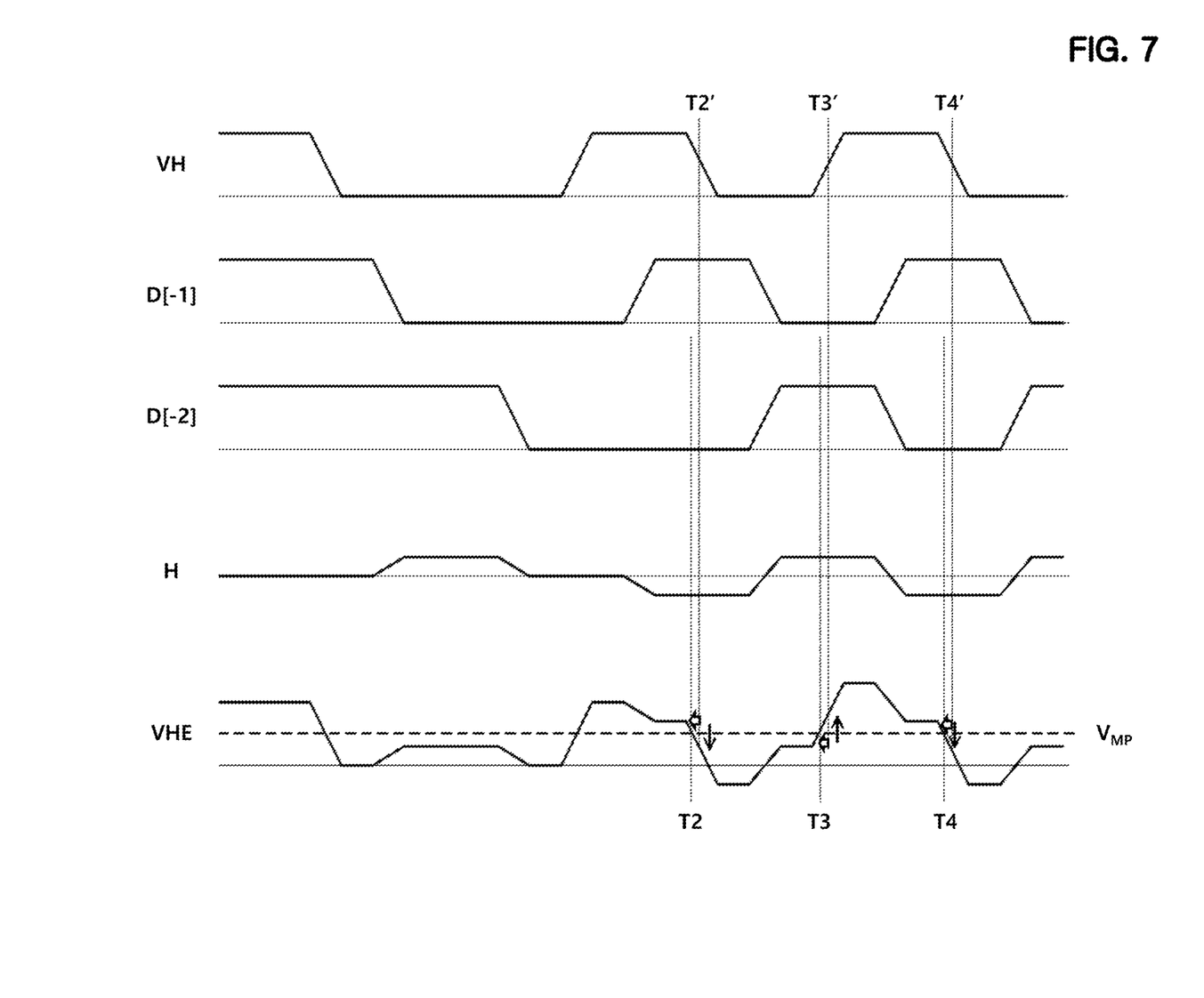
FIG. 7 illustrates a voltage adjusting circuit according to an embodiment of the present disclosure.

FIG. 7 is a waveform diagram illustrating the comparison signal VH and the equalization signal VHE.

As described with reference to FIG. 4, the comparison signal VH transitions to the low level at T2 and T4 and to the high level at T3.

In the present embodiment, the voltage adjusting circuit 310 outputs the comparison signal VH as it is when the equalization control signal H is 0, the voltage adjusting circuit 310 increases the level of the comparison signal VH when the equalization control signal H is positive (such as at time T3), and the voltage adjusting circuit 310 reduces the level of the comparison signal VH when the equalization control signal H is negative (such as at times T2 and T4).

Accordingly, the transition time corresponding to times T2 and T4 is advanced by the voltage adjusting circuit 310 because the time at which the equalization signal VHE crosses a mid-point voltage $V_{MP}$ of the sampler 320 occurs at times T2 and T4, instead of occurring at times T2' and T4' as it would have without the downward adjustment provided by the equalization control signal H.

In addition, the transition time corresponding to time T3 is advanced by the voltage adjusting circuit 310 because the time at which the equalization signal VHE crosses the mid-point voltage VMP of the sampler 320 occurs at time T3, instead of occurring at time T3' as it would have without the upward adjustment provided by the equalization control signal H.

As a result, the equalization signal VHE in which the influence of ISI shown in FIG. 4 is removed may be generated, and an error may be eliminated in the data signal D[0] passing through the sampler 320.

Figure 8:
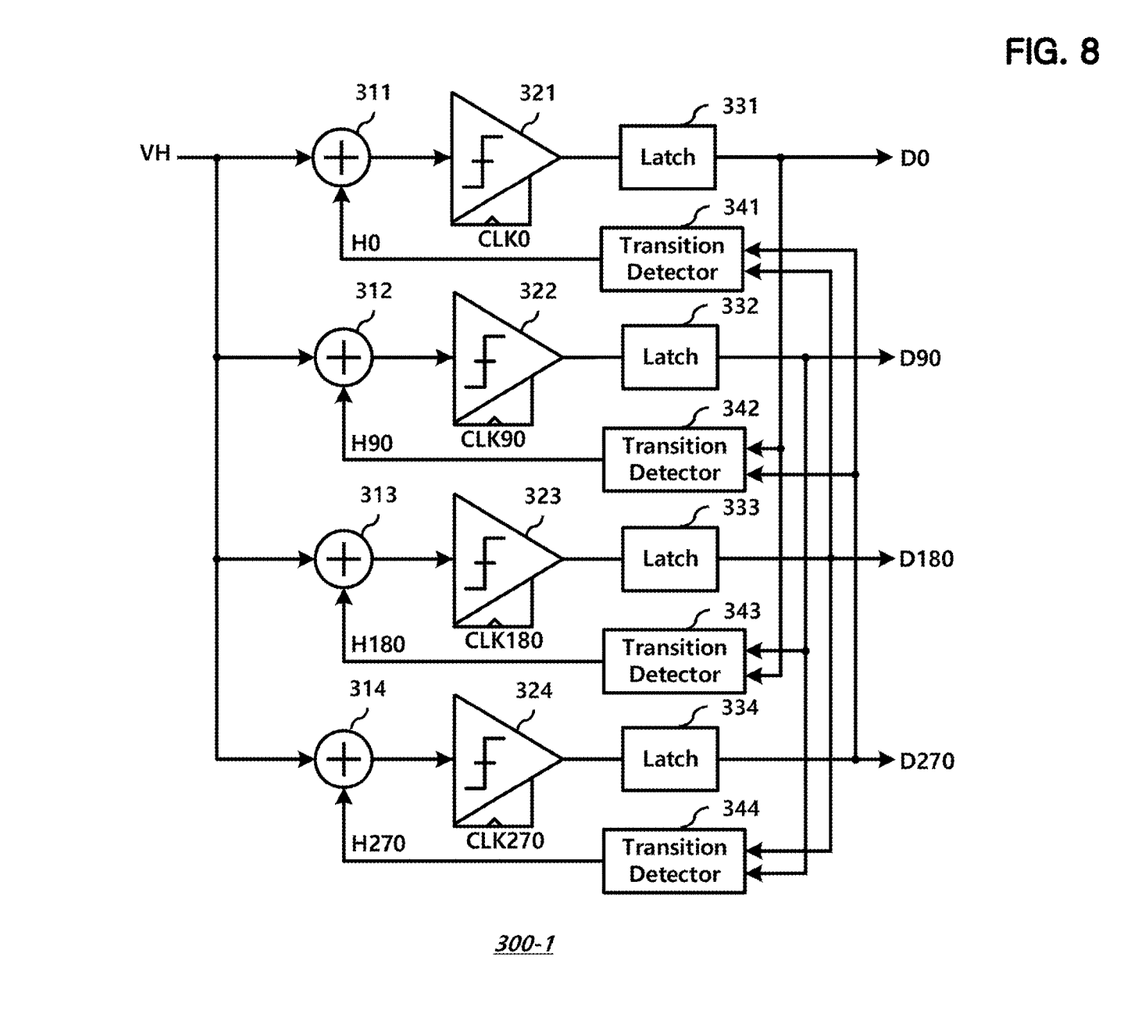
FIG. 8 illustrates a pattern detecting equalizer according to another embodiment of the present disclosure.

FIG. 8 illustrates a pattern detecting equalizer 300-1 according to another embodiment of the present disclosure.

The pattern detecting equalizer 300-1 samples four times during one cycle of the clock signal CLK using 4-phase clock signals CLK0, CLK90, CLK180, and CLK270.

That is, for a given clock frequency, the embodiment of FIG. 8 may sample at four times the frequency of the embodiment of FIG. 5.

The embodiment of FIG. 8 is substantially the same as the embodiment of FIG. 5 except that voltage adjusting circuits 311, 312, 313, and 314, samplers 321, 322, 323, and 324, latches 331, 332, 333, and 334, and transition detectors 341, 342, 343, and 344 operate for corresponding 4-phase clock signals CLK0, CLK90, CLK180 and CLK270 to produce data signal D0, data signal D90, data signal D180, and data signal D270, respectively, and therefore detailed descriptions are not repeated.

In the embodiment of FIG. 8, a circuit for outputting a data signal corresponding to each phase of the 4-phase clock signals may be referred to as a unit pattern detecting equalizer.

For example, a circuit including the voltage adjusting circuit 311, the sampler 321, the latch 331, and the transition detector 341 to provide a data signal D0 may correspond to a unit pattern detecting equalizer.

A unit pattern detecting equalizer in FIG. 8 does not include a dedicated flip-flop for storing past values of data.

For example, the transition detector 344 corresponding to the fourth phase receives the data signal D180 output from latch 333 as a first past value of the data and receives the data signal D90 output from the latch 332 as a second past value of the data. Therefore the unit pattern detecting equalizer in FIG. 8 does not require additional flip-flops for generating the first past value and the second past value.

For similar reasons, the unit pattern detecting equalizers corresponding to the remaining phases do not require dedicated flip-flops to store past values of the data either.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A derivative receiver comprising:
a differentiator circuit configured to differentiate an input signal;
a comparator circuit configured to produce a comparison signal by comparing a derivative signal produced using an output from the differentiator circuit with a threshold voltage; and
a pattern detecting equalizer circuit configured to produce a data signal by sampling an equalization signal generated by adjusting a level of the comparison signal,
wherein the level of the comparison signal is adjusted according to a past value of the data signal.

2. The derivative receiver of claim 1, further comprising an equalizer circuit configured to provide the input signal by equalizing a signal provided from a channel.

3. The derivative receiver of claim 1, further comprising an amplifier configured to produce the derivative signal by amplifying an output from the differentiator circuit.

4. The derivative receiver of claim 1, wherein the pattern detecting equalizer circuit comprises:
a voltage adjusting circuit configured to produce the equalization signal by adjusting the level of the comparison signal according to an equalization control signal;
a sampler circuit configured to provide the data signal by sampling the equalization signal according to a clock signal; and
a transition detector circuit configured to produce the equalization control signal according to the past value of the data signal.

5. The derivative receiver of claim 4, further comprising a latch configured to provide the data signal by latching an output of the sampler circuit.

6. The derivative receiver of claim 4, further comprising at least one flip-flop configured to provide the past value of the data signal according to the clock signal.

7. The derivative receiver of claim 4, wherein the transition detector circuit detects whether there was a transition of the data signal before the sampler circuit samples according to the past value of the data signal and outputs the equalization control signal to control the level of the comparison signal according to whether the transition has been detected.

8. The derivative receiver of claim 7, wherein the transition detector circuit outputs the equalization control signal configured to decrease the level of the comparison signal when a detected transition was from a low level to a high level, and outputs the equalization control signal configured to increase the level of the comparison signal when the detected transition was from the high level to the low level.

9. The derivative receiver of claim 1, wherein the pattern detecting equalizer circuit comprises a plurality of unit pattern detecting equalizers corresponding to a plurality of phases of the clock signal respectively, the unit pattern detecting equalizers configured to produce a plurality of data signals by sampling a plurality of equalization signals generated by adjusting the level of the comparison signal, respectively.

10. The derivative receiver of claim 9, wherein a first unit pattern detecting equalizer of the plurality of unit pattern detecting equalizers comprises:
 a voltage adjusting circuit configured to generate the equalization signal by adjusting the level of the comparison signal according to an equalization control signal;
 a sampler circuit configured to produce the data signal by sampling the equalization signal according to a first phase of the plurality of phases of the clock signal; and
 a transition detector circuit configured to output the equalization control signal according to the past value of the data signal.

11. The derivative receiver of claim 10, further comprising a latch to latch an output of the sampler circuit to provide the data signal.

12. The derivative receiver of claim 10, wherein the past value of the data signal is provided by a second unit pattern detecting equalizer corresponding to a second phase of the plurality of phases of the clock signal.

13. A method of receiving data performed in a receiver circuit, the method comprising:
 differentiating an input signal;
 comparing a threshold voltage with a derivative signal produced using a result of differentiating the input signal;
 generating an equalization signal by adjusting a level of the comparison signal according to a past value of a data signal; and
 producing the data signal by sampling the equalization signal.

14. The method of claim 13, further comprising producing the input signal by equalizing a signal provided from a channel.

15. The method of claim 13, further comprising:
 producing an equalization control signal according to the past value of the data signal;
 producing the equalization signal by adjusting the level of the comparison signal according to the equalization control signal; and
 producing the data signal by sampling the equalization signal according to a clock signal.

16. The method of claim 15, wherein producing the equalization signal comprises adding the equalization control signal to the comparison signal.

* * * * *